United States Patent [19]

Maruyama et al.

[11] Patent Number: 4,923,727

[45] Date of Patent: May 8, 1990

[54] LIGHTSAFE MASKING FILM

[75] Inventors: Hiroshi Maruyama, Misato; Naohiko Kiryu, Urawa; Etsuko Minezaki, Misato, all of Japan

[73] Assignee: Somar Corporation, Japan

[21] Appl. No.: 310,967

[22] Filed: Feb. 16, 1989

[30] Foreign Application Priority Data

Feb. 16, 1988 [JP] Japan .................................. 63-33612

[51] Int. Cl.$^5$ ............................................... B32B 7/06
[52] U.S. Cl. ...................................... 428/40; 428/412; 428/483; 428/476.3; 428/522; 524/30; 524/32
[58] Field of Search ................ 428/40, 412, 483, 476.3, 428/522, 500; 524/30, 32

[56] References Cited

U.S. PATENT DOCUMENTS 4,681,784  7/1987  Ebara et al. ............................ 428/40

FOREIGN PATENT DOCUMENTS 0168924  1/1986  European Pat. Off. .
0188292  7/1986  European Pat. Off. .

OTHER PUBLICATIONS

Patent Abstracts of Japan, vol. 7, No. 216 (P-225) 24 Sep. 83, & JP-A-58 108 537.
Patent Abstracts of Japan, vol. 10, No. 290 (P-503) 2 Oct. 86, & JP-A-61 110 141.

*Primary Examiner*—Edith Buffalow
*Attorney, Agent, or Firm*—Lorusso & Loud

[57] ABSTRACT

A lightsafe masking film is disclosed which comprises a substrate, and a peelable lightsafe layer provided over the surface of the substrate and including a lightsafe substance, a copolymer containing vinyl chloride, and a mixture of a first nitrile rubber containing 25–30% by weight of acrylonitrile and a second nitrile rubber containing 31–35% by weight of acrylonitrile.

13 Claims, No Drawings

LIGHTSAFE MASKING FILM

This invention relates generally to a lightsafe masking film and, more specifically, to a composite, lightsafe masking film to be used as an original copy having a transparent pattern in the photomechanical reproduction process.

One known lightsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there is left a desired transparent pattern on the masking film.

The lightsafe layer is generally composed of a binder and a lightsafe substance such as a colorant capable of blocking light having a wavelength of 550 nm or less. As a component of the binder, a nitrile rubber containing about 33 % by weight of acrylonitrile (such as Nipol 1432J (trademark)) has been generally used. It has been found, however, that a lightsafe layer containing such a nitrile rubber is not fully satisfactory with respect to its properties such as cracking tendency, elongation tendency, small portion retentivity and blocking-preventing property. In particular, the physical properties are susceptible to temperature variation and, especially, the light safe layer tends to be cracked at a temperature of below 15° C.

The present invention has been made to overcome the above-described drawbacks of the conventional masking film and provides a lightsafe masking film, comprising a substrate, and a peelable lightsafe layer provided over the surface of said substrate and including a lightsafe substance, a copolymer containing vinyl chloride, and a mixture of a first nitrile rubber containing 25-30% by weight of acrylonitrile and a second nitrile rubber containing 31-35% by weight of acrylonitrile.

The present invention will now be described in detail below.

Lightsafe masking film according to the present invention is generally comprised of a transparent substrate formed of a plastic material having provided thereon a peelable, transparent, lightsafe layer.

Any plastic material conventionally used as a transparent substrate in known lightsafe masking films can be used for the purpose of the present invention. Synthetic resin films, semisynthetic resin films and laminated films thereof may be used as the substrate. Illustrative of suitable synthetic resin films are those formed of a polyester such as polyethylene terephthalate or polybutylene terephthalate, an aromatic polyamide, an aliphatic polyamide, a polyolefin such as polyethylene or polypropylene, a polystyrene, a polycarbonate, a polyvinyl chloride and a polyvinylidene chloride. Illustrative of a suitable semisynthetic resin film is that formed of a cellulose acetate. Examples of the laminated films include those using a combination of synthetic resin layers, a combination of synthetic resin and semisynthetic resin layers, a combination of a cellulose layer and a synthetic resin layer and/or a semisynthetic resin layer. Above all, a polyethylene terephthalate film is an especially preferred substrate for reasons of excellent dimensional stability and excellent tensile strength and tearing strength. The thickness of the film is generally in the range of 20-300 μm, preferably 50-250 μm. Both stretched and non-stretched films may be used as the substrate.

The substrate is overlaid with a peelable, lightsafe layer generally composed of a binder, and a lightsafe or lightshading substance.

It is important that a combination of a copolymer containing vinyl chloride and a mixture of a first nitrile rubber containing 25-30% by weight of acrylonitrile and a second nitrile rubber containing 31-35% by weight of acrylonitrile should be used as the binder.

As the vinyl chloride-containing copolymer, there may be mentioned a vinyl chloride-vinylidene chloride copolymer, a vinyl chloride-vinyl acetate copolymer, a vinyl chloride-acrylic ester copolymer and a vinyl chloride-vinyl acetate-maleic acid terpolymer. These vinyl chloride-containing copolymers may be used by themselves or as a mixture of two or more.

The first and second nitrile rubbers to be used in conjunction with the vinyl chloride-containing copolymer may be, for example, copolymers of acrylonitrile and butadiene, acrylonitrile-butadiene rubbers or terpolymers of acrylonitrile, butadiene and a carboxyl group-containing copolymerizable monomer. Especially preferred is the use of a nitrile rubber containing about 27% by weight of acrylonitrile as the first nitrile rubber and a nitrile rubber containing about 33% by weight of acrylonitrile as the second nitrile rubber.

The weight ratio of the first nitrile rubber to the second nitrile rubber is preferably in the range of 4:1 to 1:4, more preferably 3:1 to 1:2, most preferably 2:1 to 1:1. The vinyl chloride-containing copolymer is generally used in an amount of 50-95% by weight, preferably 60-90% by weight based on the weight of the binder, i.e. based on the total of the weight of the first and second nitrile rubber and the vinyl chloride-containing copolymer.

The cojoint use of the first and second nitrile rubber in conjunction with the vinyl chloride-containing copolymer can solve the above-mentioned problems of the conventional masking films. That is, such a cojoint use can improve the peelability of the resulting lightsafe layer. Moreover, it can afford a lightsafe layer having improved anti-cracking property, lengthening property, small portion retentivity and blocking-preventing property.

The kind and color of the lightsafe substance to be incorporated into the lightsafe layer are not specifically limited as long as the resulting lightsafe layer can block light having a wavelength of 300-550 nm. Red, yellow or amber colorants of an oil-soluble type, a direct dye-type, a reaction-type or an acidic-type may be suitably used. Two or more colorants can be used in combination. Colorant soluble in an organic solvent is generally used for reasons of easiness of formation of the lightsafe layer on the substrate. The lightsafe substance is used in an amount so that the resulting lightsafe layer can block light having a wavelength of 300-550 nm.

The lightsafe layer may, if desired, contain a filler. While both organic and inorganic fillers may be used, the use of organic ones is more preferable. Examples of suitable inorganic fillers include silica, clay and alumina. Examples of suitable organic fillers include a cross-linked polystyrene, a benzoguanamine-formaldehyde condensation product, a polyamide (e.g. 6,6-nylone, 6-nylone or 12-nylone), a silicone resin, a crystalline cellulose, a phenol-formaldehyde resin, a fluororesin, a polyethylene resin or an acrylic resin. Of these fillers, the use of polystyrene beads is particularly preferred, because it is effective in improving homogeneity of a coating composition for the formation of the lightsafe layer, in improving peelability of the lightsafe layer from the substrate while maintaining desired bonding therebetween, in supressing reflection of light on the surface of the lightsafe layer, and in reducing the surface tackiness of the lightsafe layer.

The filler preferably has a particle size of 0.5–20 μm, more preferably 2–15 μm and is preferably used in an amount of 0.1–30%, more preferably 0.5–20% based on the weight of the binder.

Further, a liquid organopolysiloxane may be incorporated into the lightsafe layer so as to improve adhesivity of the lightsafe layer to the substrate without adversely affecting peelability. Illustrative of suitable organopolysiloxane is a dimethylpolysiloxane, a methylethylpolysiloxane, a methylphenyl-polysiloxane, a methylvinylpolysiloxane, a copolymer of dimethylpolysiloxane and an oxyalkylene or a polysiloxane modified with a higher alkyl. The organopolysiloxane is preferably used in an amount of 0.01–1.5% based on the weight of said binder.

The lightsafe layer may be prepared by any known manner such as by applying a coating composition containing the above ingredients on the surface of the substrate. A solvent such as an alcohol, an ester, a hydrocarbon, a halogenated hydrocarbon, a ketone or the like organic solvent can be used for the formation of the coating composition. The coating composition may further contain a leveling agent and a plasticizer, if desired. The lightsafe layer generally has a thickness of 10–50 μm, preferably 20–40 μm.

It is possible to provide a pressure sensitive adhesive layer between the substrate and the lightsafe layer so that the resulting masking film may permit the reuse of a cut lightsafe layer, peeled off from the substrate, for resticking. Such a adhesive layer is formed of a synthetic resin adhesive such as an acrylate ester copolymer, a saturated polyester or a polyurethane, or a rubber adhesive such as a natural rubber, a chloroprene rubber, isoprene rubber or a nitrile rubber.

The lightsafe masking film according to the present invention may be suitably used for the masking of a room light photosensitive material, such as of a silver halide-type or a photopolymer-type, which is sensitive to light with wavelengths of 400 nm or less.

The following examples will further illustrate the present invention. In the examples, "part" is by weight. The test methods and evaluation of the test results in the following examples are as follows:

(1) Peelability:
Lightsafe layer of sample masking film is cut with a cutter knife into square patterns and one of the squares is peeled off with fingers from its corner. Peelability is evaluated and rated as being good or bad.

(2) Bonding strength:
Using a surface property measuring machine HEIDON 14 (Shintoh Manufacturing K. K.), a force required for peeling off the lightsafe layer is measured.

(3) Blocking tendency:
Two masking films are superimposed with the substrate of the upper masking film contacting with the lightsafe layer of the lower masking film. The two films are then allowed to stand at a temperature of 50° C. and a relative humidity of 80% for 5 hours while applying a load of 25 g/m² to the films. Tendency of the films to stick to each other at their contact is examined and is rated as follows:

5: No blocking
4: Blocking very slightly occurs
3: Blocking occurs partly
2: Blocking occurs at a greater part of the area
1: Blocking occurs entire area (4) Cracking tendency:
Tendency of lightsafe layer to crack during peeling is checked and is rated as follows:
5: No cracking
4: Hardly cracks
3: Cracking occurs partly
2: Relatively easily cracks
1: Very easily cracks (5) Tendency to lengthen:
The degree of stretching of the lightsafe layer during peeling operation is evaluated and rated as follows:
5: Considerably lengthened
4: Fairly lengthened
3: Moderately lengthened
2: Slightly lengthened
1: Not at all lengthened (6) Small pattern retentivity:
The lightsafe layer is cut to form circular patterns having diameters ranging from 0.5 to 5 mm and spaced apart with a distance of 1 mm. The remainder portion of the lightsafe layer is peeled off. The surface of the masking film having lightsafe circular patterns is rubbed. Easiness of the circular patterns to be peeled off is evaluated and rated as follows:
5: Not peeled off at all
4: A greater part of circular patterns remain unpeeled
3: About half of circular patterns remain unpeeled
2: A greater part of circular patterns are peeled off
1: All of the circular patterns are peeled off (7) Tendency to be curled:
Lightsafe layer of sample masking film is cut with a cutter knife into squares with a side length of 1 m. The masking film is then placed on a flat table with the lightsafe layer being upside and is allowed to stand at room temperature for 24 hours. Each corner of the film is checked to see degree of curling of the film in terms of the height of the corner of the film from the table surface. Curling tendency is rated as follows:
3: less than 2 mm
2: between 2–5 mm
1: more than 5 mm

EXAMPLES 1–5

A coating composition was prepared by mixing 38.7 parts of a mixed solution composed of a first 20% solution of a nitrile rubber (N-27, acrylonitrile content: 27% by weight) in methyl ethyl ketone and a second 20% solution of a nitrile rubber (N-33, acrylonitrile content: 33% by weight) in methyl ethyl ketone, 72.1 parts of a 25% solution of a vinyl chloride/vinyl acetate/maleic acid terpolymer (monomer ratio: 86:13:1, DENKA VINYL 1000C. manufactured by Denki Kagaku Kogyo K. K.) in methyl ethyl ketone, 7.7 parts of a colorant (Valiozol Orange 3210T), 0.28 part of fine particulate polyethylene, 0.05 parts of an organosiloxane (SILICONE KP-356, manufactured by Shinetsu Kagaku Kogyo K.K. and 3.5 parts of methyl ethyl ketone. The weight ratio of the first solution to the second solution of the mixed solution are as shown in Table 1 below.

The coating composition was then uniformly applied over the surface of a polyethylene film (thickness: 75 μm) by a roll coater method and the coat was dried at 100° C. to obtain a masking film composed of the polyethylene film substrate having provided thereon a lightsafe layer with a thickness of 25 μm. The resulting masking film was then subjected to various tests to obtain the results shown in Table 1.

COMPARATIVE EXAMPLES 1 and 2

Example 1 was repeated in the same manner as described except that N-27 and N-33 were used by themselves. The masking films showed the test results as shown in Table 1.

TABLE 1

| Example | Comp. 1 | 1 | 2 | 3 | 4 | 5 | Comp. 2 |
|---|---|---|---|---|---|---|---|
| N-27/N-33 ratio | 4/0 | 3/1 | 2/1 | 1/1 | 1/2 | 1/3 | 0/4 |
| Bonding strength (g/cm) | 120 | 110 | 110 | 110 | 100 | 90 | 90 |
| Blocking tendency | 4 | 4 | 4 | 4 | 3 | 3 | 2 |
| Peelability | good | good | good | good | good | good | good |
| Cracking tendency | | | | | | | |
| (25° C.) | 5 | 5 | 4 | 4 | 3 | 3 | 3 |
| (10° C.) | 4 | 4 | 3 | 3 | 2 | 2 | 1 |
| Tendency to lengthen | | | | | | | |
| (25° C.) | 3 | 3 | 3 | 3 | 3 | 3 | 2 |
| (10° C.) | 3 | 3 | 3 | 2 | 2 | 2 | 1 |
| Small pattern retentivity | | | | | | | |
| (25° C.) | 4 | 4 | 4 | 4 | 3 | 3 | 2 |
| (10° C.) | 3 | 3 | 3 | 3 | 2 | 2 | 1 |
| Curling tendency | 1 | 2 | 3 | 3 | 3 | 3 | 3 |

What is claimed is:

1. A lightsafe masking film, comprising a substrate, and a peelable lightsafe layer provided over the surface of said substrate and including a lightsafe substance, a copolymer containing vinyl chloride, and a mixture of a first nitrile rubber containing 25–30% by weight of acrylonitrile and a second nitrile rubber containing 31–35% by weight of acrylonitrile.

2. A masking film as set forth in claim 1, wherein said first and second nitrile rubbers are copolymers of acrylonitrile and butadiene or terpolymers of acrylonitrile, butadiene and a carboxyl group-containing copolymerizable monomer.

3. A masking film as set forth in claim 2, wherein the contents of acrylonitrile in said first and second nitrile rubbers are about 27% by weight and about 33% by weight, respectively.

4. A masking film as set forth in claim 1, wherein the weight ratio of said first nitrile rubber to said second nitrile rubber is in the range of 4:1 to 1:4.

5. A masking film as set forth in claim 1, wherein the weight ratio of said first nitrile rubber to said second nitrile rubber is in the range of 3:1 to 1:2.

6. A masking film as set forth in claim 1, wherein the weight ratio of said first nitrile rubber to said second nitrile rubber is in the range of 2:1 to 1:1.

7. A masking film as set forth in claim 1, wherein said vinyl chloride-containing copolymer is a vinyl chloride/vinylidene chloride copolymer, a vinyl chloride/vinyl acetate copolymer, a vinyl chloride/acrylic ester copolymer or a vinyl chloride/vinyl acetate/maleic acid terpolymer.

8. A masking film as set forth in claim 1, wherein said lightsafe layer further comprises a filler.

9. A masking film as set forth in claim 1, wherein said filler is an organic filler selected from a cross-linked polystyrene, a benzoguanamine-formaldehyde condensation product, a polyamide, a silicone resin, a crystalline cellulose, a phenol-formaldehyde resin, a fluororesin, a polyethylene resin and an acrylic resin or an inorganic filler selected from silica, clay and alumina.

10. A masking film as set forth in claim 1, wherein said filler has a particle size of 0.5–20 μm.

11. A masking film as set forth in claim 1, wherein said lightsafe layer further comprises an organopolysiloxane.

12. A masking film as set forth in claim 1, wherein said organopolysiloxane is a dimethylpolysiloxane, a methylethylpolysiloxane, a methylphenylpolysiloxane, a methylvinylpolysiloxane, a copolymer of dimethylpolysiloxane and an oxyalkylene or a polysiloxane modified with an alkyl.

13. A masking film as set forth in claim 12, wherein said organopolysiloxane is used in an amount of 0.01–1.5% based on the total weight of said vinyl chloride-containing copolymer and said first and second nitrile rubbers.

* * * * *